United States Patent [19]

Goddard et al.

[11] Patent Number: 4,541,475
[45] Date of Patent: Sep. 17, 1985

[54] METHOD OF, AND APPARATUS FOR, PRODUCING CASTINGS IN A VACUUM

[75] Inventors: John Goddard; David Mills; Alan J. Moulden, all of Bristol, England

[73] Assignee: Rolls-Royce Limited, London, England

[21] Appl. No.: 451,197

[22] Filed: Dec. 20, 1982

[30] Foreign Application Priority Data

Dec. 30, 1981 [GB] United Kingdom ............... 8139034

[51] Int. Cl.$^4$ ............................................ B22D 27/16
[52] U.S. Cl. .................................... 164/65; 164/253; 164/338.1
[58] Field of Search .................. 164/61, 65, 253–258, 164/338.1

[56] References Cited

U.S. PATENT DOCUMENTS

| 3,897,815 | 8/1975 | Smashey | 164/127 |
| 4,044,815 | 8/1977 | Smashey | 164/35 |
| 4,178,986 | 12/1979 | Smashey | 164/338.1 |

FOREIGN PATENT DOCUMENTS

| 1558159 | 3/1970 | Fed. Rep. of Germany . | |
| 2135159 | 7/1971 | Fed. Rep. of Germany . | |
| 2451464 | 5/1975 | Fed. Rep. of Germany . | |
| 45-13087 | 5/1970 | Japan . | |
| 52-23888 | 6/1977 | Japan . | |
| 0414955 | 12/1966 | Switzerland | 164/61 |
| 1349099 | 3/1974 | United Kingdom . | |
| 1356890 | 6/1974 | United Kingdom . | |

OTHER PUBLICATIONS

Resistally, Ltd., "Fecralloy A", Alloy Data Sheet, Sep. 1978.
Resistalloy, Ltd., "Fecralloy Steels: The Answer to Spriralling Furnace Costs".

Primary Examiner—Nicholas P. Godici
Assistant Examiner—Richard K. Seidel
Attorney, Agent, or Firm—Parkhurst & Oliff

[57] ABSTRACT

Apparatus for casting in a vacuum has a single evacuable furnace chamber 10 in which the charge melting and mould heating takes place. The charge is melted in a crucible 24 by an induction coil 20, while the mould is heated by resistance heaters 18 which are made from a FECRALLOY (Registered Trade Mark) material and can be operated in air or vacuum. In operation an empty mould 16 and a charged crucible 24 are positioned in the furnace 14 and the furnace chamber is sealed. The heaters 20 and 18 are operated while the furnace is pumped down. A control device 40 ensures that the charge is not melted until the appropriate vacuum level has been reached. After pouring the filled mould is withdrawn into a withdrawal zone 25 and as soon as the casting has solidified to the extent that air can be admitted to the chamber without detriment, the vacuum is released and the mould and charge replaced. The furnace described is relatively inexpensive, having no water cooled valves between chambers, and the process is relatively quick and inexpensive due to the heating of the mould during evacuation of the chamber.

5 Claims, 1 Drawing Figure

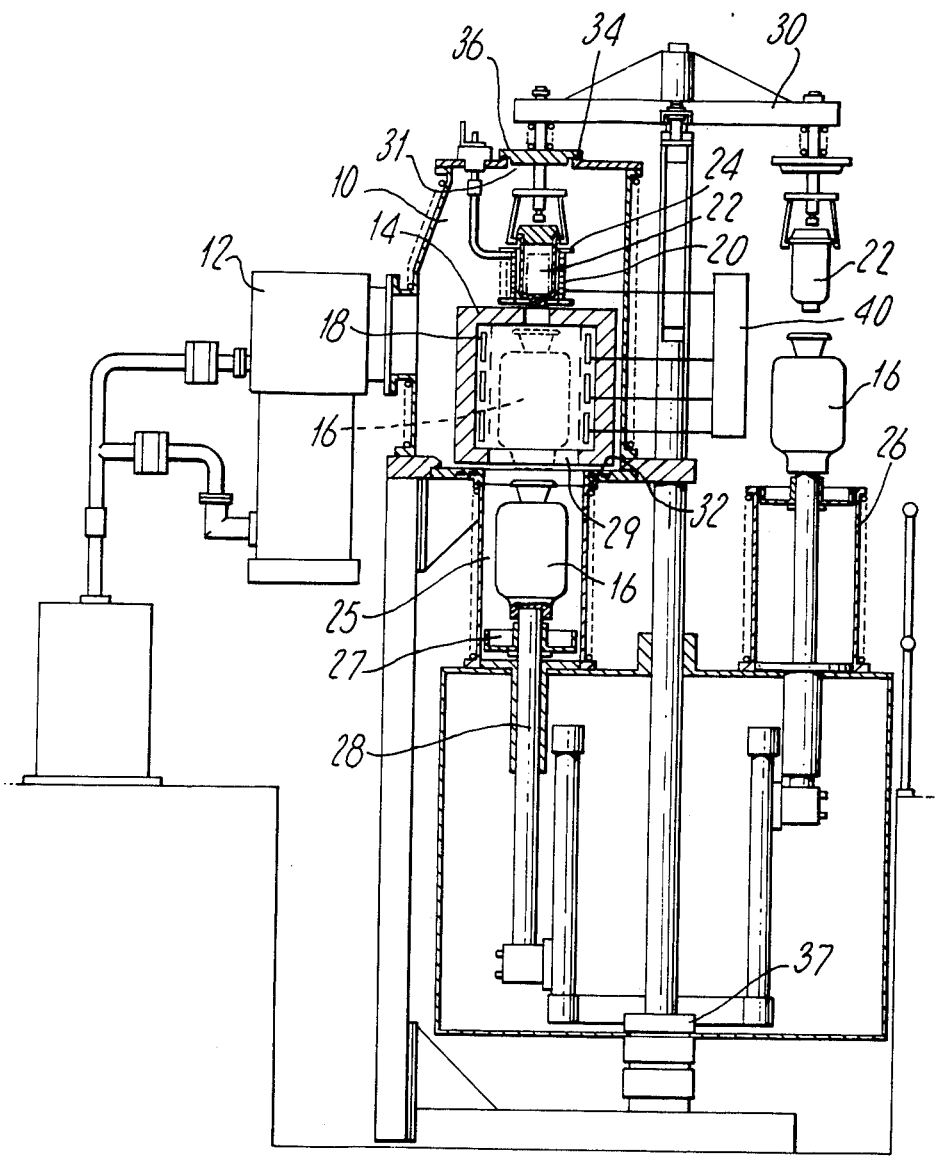

METHOD OF, AND APPARATUS FOR, PRODUCING CASTINGS IN A VACUUM

The present invention relates to a method of, and apparatus for, producing castings in a vacuum.

In a conventional vacuum casting furnace there are usually three separate chambers, a central casting chamber in which the charge is melted in a crucible and poured into a mould, a top chamber above the crucible through which a further metal charge can be transferred to the crucible, after pouring, and a withdrawal chamber below the mould, through which the filled mould is removed from the furnace and a new, empty mould is supplied to the furnace. Apparatus is provided for lowering the new charge into the crucible from the top chamber, and for raising the mould into the casting chamber. Also the moulds are pre-heated to a specified temperature before pouring.

In order that the metal charge can be melted and cast in vacuum conditions, a vacuum pump and associated apparatus are provided for creating the appropriate vacuum conditions and, at least in the central casting chamber, heaters for the mould must be provided, usually consisting of graphite, which do not deteriorate under vacuum conditions.

Once the vacuum is established, however, in order to replace a mould and charge, either the vacuum must be released, or the top chamber and the withdrawal chamber must also be evacuated, before the new charge and mould are supplied to the central chamber.

In the first case, where the vacuum is released, to avoid deterioration of the hot graphite heaters in the air, the practice has grown up of allowing the furnace to cool before admitting air to the casting chamber. This increases the cycle time for production of a casting.

In the second case where the vacuum is maintained, the casting chamber remains hot and the cycle time is reduced, but because of the time required to pre-heat the mould before pouring, it has also become the practice to pre-heat the moulds to the required temperature in a separate furnace, and to transfer the hot moulds to the casting furnace thus reducing the time during which the casting furnace is used simply for mould pre-heating. However, the use of a separate furnace is expensive in energy and gives rise to problems in handling the hot moulds. Also there is a loss of control over the actual casting process in that, between removal from the pre-heating furnace, and metal being poured into it, the mould has time to cool down, and the degree of cooling in each cycle may be different.

A further problem is that the valves used to isolate the central chamber from the other chambers until the required vacuum has been attained in the other chambers, have to work at high temperatures. Thus they are usually designed to be water-cooled which makes them complex and they have to be regularly serviced, thus taking the furnace out of production.

The furnaces designed to produce columnar grained, or single crystal articles included heaters for the moulds as a requirement of the process. The practice still persisted, however, of providing for the evacuation and sealing of the withdrawal chamber so that the vacuum could be maintained in the casting chamber at all times. This practice is illustrated in U.K. patent No. 1,349,099 in which there is described a three chamber furnace in which all of the chambers may be evacuated and isolated from each other, and in which separate heaters are provided in the top and middle chambers for heating the charge and the mould from cold respectively. An alternative process is described in German Offenlegungsschrift No. 2,451,464, in which only two chambers are provided, a heating chamber in which both the charge and the mould are heated simultaneously, and a withdrawal chamber into which the filled mould is withdrawn. In this process the mould includes a charge in a separate cavity. It is still an essential feature of the process described in this document, however, that a vacuum is producable in the withdrawal chamber and the heating chamber can be isolated from the withdrawal chamber by a vacuum valve which prevents admission of air to the heating chamber.

An object of the present invention is to provide a casting apparatus which enables parts to be cast in vacuum with a relatively short cycle time and without the need for complex vacuum valves between the various parts of the furnace.

Another object of the present invention is to provide a method of casting in which the mould heating takes place simultaneously with the evacuation of the chamber, and in which air is admitted to the hot chamber as soon as the cast article has solidified to the extent that the air will not have any serious detrimental effect on the article.

According to the present invention apparatus for casting in a vacuum comprises a furnace chamber, a furnace within the chamber, inlets through which a mould and a crucible can be positioned in the chamber, means for sealing the inlets to enable a vacuum to be created within the chamber, a vacuum pump communicating with the chamber for creating said vacuum, the furnace including heaters for heating the mould and a charge positioned in the crucible, the heaters being capable of operation both in air and in vacuum.

In use of apparatus according to the invention, it is possible to introduce a relatively cold mould into the furnace while the chamber is full of air, and to be heating the mould while the chamber is being evacuated, thus reducing the overall cycle time and energy consumption. Similarly, as soon as the casting has been poured, and has partially solidified to the extent that it can be exposed to air without detriment, air can be admitted to the chamber without switching off the mould heaters. The full mould is then replaced by an empty one and the metal charge replaced.

It can be seen that all of the problems associated with the vacuum valves between various chambers in the prior art furnaces have been eliminated, and so has the costly use of additional furnaces for pre-heating the moulds. This results in a much cheaper furnace than has hitherto been available and a reduction in process costs.

In one embodiment of the invention a withdrawal zone is provided below the furnace, which is in open communication with the furnace chamber and into which the filled mould is withdrawn for cooling after pouring has taken place.

Also according to the present invention a method of casting articles in vacuum comprises the steps of:

supplying an empty mould and a charge of casting material to a furnace in a chamber, sealing the chamber against ambient atmosphere, heating the mould and the charge of material while simultaneously evacuating the chamber, but ensuring that the charge does not melt until a safe vacuum level is reached, casting the article and allowing the casting to cool, and, when the casting has solidified to the extent that it can be exposed to air without detriment, and before significant cooling of the furnace takes place, admitting air into the chamber so that the mould and charge can be replaced.

One example of the invention will now be more particularly described with reference to the accompanying drawing which is a cross-sectional elevation of a casting apparatus of the present invention.

The apparatus comprises a furnace chamber 10 which is evacuable by a pump 12. Within the furnace chamber 10 is a furnace 14 in which a mould 16 may be heated by heaters 18. Above the mould heaters the furnace also includes a crucible heater 20 for melting a charge of metal indicated at 22, inside a crucible 24.

Below the furnace is a withdrawal zone 25 which is in open communication with the furnace chamber 10 and into which empty moulds are placed prior to their insertion into the furnace. The moulds are supported on a base plate 27 and a ram device 28 is provided for raising and lowering the moulds 16 into and out of the furnace through an inlet 29 to the furnace chamber. In this example the withdrawal zone is formed within a separate compartment 26 but which, due to the open communication with the furnace chamber 10, is regarded as a part of the furnace chamber 10.

To reduce the overall process time the withdrawal compartment 26 is made as a separate movable part of the apparatus, and a plurality of such compartments are mounted along with a similar number of crucibles 24 on rotary arms 27,30 so that one or more additional moulds and crucibles can be prepared outside the furnace while a casting process is being carried out within it. The crucibles are inserted into and withdrawn from the furnace chamber through an inlet 31. The furnace chamber includes sealing elements 32 and 34 against which the top surface of the withdrawal compartment, and a cover 36 respectively, form gas tight seals for sealing the inlets 29 and 31.

The crucible heater 20 is an induction coil which may be of conventional form for melting the charge. These heaters have previously been operated without detriment in air or vacuum. The mould heater, however, is a powerful resistance heater and conventional heaters have been suitable only for operation either in air or in vacuum. For the present process to be effective, therefore, a type of heater is required which will be suitable for heating ceramic moulds either in air or in vacuum. For this purpose, resistance heaters made, for example, from the material known as FECRALLOY (Registered Trade Mark) were chosen, this material being an alloy containing Iron, Chromium, Aluminium and Yttrium and having considerable resistance to corrosion in air at elevated temperature.

The operation of the furnace is as follows:

A crucible containing a charge of material, usually in the form of bar stock, is placed in the crucible heater and the cover 36 sealed. Simultaneously an empty mould in a withdrawal zone is positioned below the furnace and the chamber sealed. As soon as the seal is effected the pump 12 can be operated to create a vacuum in the chamber while the mould 16 is moved into position in the furnace, and the furnace heater is switched on. As soon as the vacuum has reached a pre-determined level the crucible heater is switched on, the arrangement being such that no significant melting of the charge takes place until the appropriate vacuum level has been reached. In the present example a fusible plug of charge material closes the bottom of the crucible until the melting of the charge melts the plug to provide automatic pouring. The pouring is timed, by control of the heaters, to coincide with the attainment of the correct temperature by the mould. As soon as pouring has taken place the mould and crucible heater are switched off, the mould is withdrawn into the withdrawal chamber and the casting allowed to cool to the point at which exposure to air is not detrimental to the casting material. Then, with the furnace still hot, the vacuum is released, the mould and crucible are withdrawn and replaced by new ones. Once the furnace is again sealed, the pump is operated and the process is repeated.

It can thus be seen that the furnace design is extremely simple, requiring only one evacuable chamber and no valves between chambers as in the past. Casting time is kept to a minimum and depends almost entirely on the time required to heat the mould. With a powerful resistance heater this can be achieved from cold in a few minutes. This time may be shortened, and thermal shock on the mould reduced, by some pre-heating in a second furnace but this pre-heating time and hence cost can be very much reduced compared to present practice.

Clearly modifications may be added to the process described above. For example, the withdrawal compartment could be eliminated and the base plate on which the mould is placed designed to seal the aperture in the chamber when the mould is in position in the furnace. In this case the mould must remain within the furnace until the metal has begun to solidify before the vacuum can be broken. Although this modification makes the design of the apparatus still simpler, it may add to the process time.

The mould heater may be in the form of separately controllable bands to enable temperature gradients to be established in the mould. Such heaters and their control devices are known from directional solidification furnaces and are not described in detail. However, a control device for controlling the timing and temperature of the heaters is illustrated at 40.

We claim:

1. Apparatus for casting in a vacuum comprising:
   a furnace chamber;
   a furnace within the chamber;
   inlets in the walls of the furnace chamber through which a mould and a crucible can be positioned in the chamber;
   a withdrawal chamber in open communication, without valves, with the interior of the furnace chamber through the crucible positioning inlet, and into which a filled mould can be withdrawn from the furnace for cooling;
   means for sealing the inlets to enable a vacuum to be created within the furnace and withdrawal chambers;
   a vacuum pump communicating with the chambers for creating said vacuum;
   the furnace chamber including heaters for heating the mould and a charge positioned in the crucible, the heaters being capable of operation substantially without detriment both in air and in vacuum.

2. Apparatus as claimed in claim 1 and in which the mould heater comprises a resistance heater made from an alloy of Iron, Chromium, Aluminium and Yttrium.

3. Apparatus as claimed in claim 1 and in which the withdrawal chamber comprises a movable compartment which is sealed to the furnace chamber during the casting process but which can be detached therefrom for removal and replacement of moulds.

4. Apparatus as claimed in claim 3 and in which the mould heater comprises a resistance heater made from an alloy of Iron, Chromium, Aluminium and Yttrium.

5. A method of casting articles in a vacuum comprising the steps of:

supplying an empty mould and a charge of casting material to a furnace chamber, sealing the chamber against ambient atmosphere, heating the mould and the charge of material while simultaneously evacuating the chamber, but ensuring that the charge does not melt until a safe vacuum level is reached, casting the article and allowing the casting to cool, and, when the casting has solidified to the extent that it can be exposed to air without detriment, and before significant cooling of the furnace takes place, admitting air into the chamber so that the mould and charge can be replaced.

* * * * *